US005512861A

United States Patent [19]

Sharma

[11] Patent Number: 5,512,861
[45] Date of Patent: Apr. 30, 1996

[54] BUFFER STAGE FOR USE WITH A CURRENT CONTROLLED OSCILLATOR

[75] Inventor: Vivek Sharma, Le Fontanil, France

[73] Assignee: SGS-Thomson Microelectronics S.A., Saint-Genis, France

[21] Appl. No.: 360,147

[22] Filed: Dec. 20, 1994

[30] Foreign Application Priority Data

Dec. 30, 1993 [EP] European Pat. Off. ............ 93420513

[51] Int. Cl.$^6$ .......................... H03B 5/24; H03K 3/017; H03K 5/04
[52] U.S. Cl. .................. 331/74; 331/57; 331/177 R
[58] Field of Search .................. 331/34, 57, 74, 331/75, 108 R, 111, 116 FE, 117 FE, 143, 150, 177 R, 183; 327/108–112, 256, 291, 333; 326/80, 81, 83

[56] References Cited

U.S. PATENT DOCUMENTS

| 4,565,976 | 1/1986 | Campbell | 331/34 X |
| 5,117,131 | 5/1992 | Ochi et al. | 326/81 X |
| 5,136,189 | 8/1992 | Demaris | 326/81 X |
| 5,175,512 | 12/1992 | Self | 331/57 |
| 5,180,995 | 1/1993 | Hayashi et al. | 331/57 |
| 5,394,038 | 2/1995 | Sobue et al. | 326/83 X |
| 5,412,258 | 5/1995 | Ogawa et al. | 327/108 X |

OTHER PUBLICATIONS

IBM Technical Disclosure Bulletin, vol. 31, No. 2, Jul. 1988, Armonk (New York, US) pp. 154–156 "CMOS Ring Oscillator With Controlled Frequency".
IEEE International Solid State Circuits Conference, vol. 32, Feb. 1989, New York, US pp. 150–151, Scott et al. "A 16 Mb/s Data Detector And Timing Recovery Circuit For Token Ring LAN".

*Primary Examiner*—David Mis
*Attorney, Agent, or Firm*—David M. Driscoll; James H. Morris; Richard F. Giunta

[57] ABSTRACT

A ring oscillator buffer stage, supplied by an adjustable current source of an asymmetrical current controlled ring oscillator, is provided for amplifying the output of the ring oscillator. The frequency of the ring oscillator varies as a function of a control signal. The buffer stage includes; a plurality of current controlled buffers, supplied by currents which are controlled in correspondence with the control signal, for amplifying the output of the oscillator; and a buffer for amplifying the output of the current controlled buffers for providing a full-swing output signal with a duty cycle of approximately 50%.

34 Claims, 4 Drawing Sheets

५,५१२,८६१

BUFFER STAGE FOR USE WITH A CURRENT CONTROLLED OSCILLATOR

BACKGROUND OF THE INVENTION

1. Field of the Invention

The invention concerns a controlled oscillator and more particularly an output driver stage for such an oscillator, providing a 50% duty cycle output signal. A driver is also well known and referred to as a buffer.

2. Discussion of the Related Art

FIG. 1 illustrates a partial schematic and partial circuit diagram of an output driver stage for use with an asymmetrical current controlled oscillator as described in the European patent application 93420390.2.

Referring to FIG. 1, an adjustable current source S1 having its high side connected to a positive voltage supply rail VDD supplies, via its low side 5, the high side of a three stage ring oscillator 10. The current source S1 is adjusted by a frequency control signal 8.

The ring oscillator 10 comprises three CMOS inverters 20. The high side of each inverter is connected to the low side 5 of the current source S1. The low side of each inverter is connected to a negative supply rail VSS.

The output of each inverter 20, starting with the left-most inverter, is connected to the input of the succeeding inverter. The output 25 of the right-most inverter is connected to the input of the left-most inverter. Thus, an unbroken ring 10 of three inverters is created.

The current source S1 and the ring oscillator 10 are connected together in such a manner that they form an asymmetrical current controlled oscillator 30.

An output buffer 35 comprises a P-MOS and an N-MOS transistor, respectively MP5 and MN5. The source terminals of transistors MP5 and MN5 are respectively connected to the positive supply rail VDD and the negative supply rail VSS, and their drain terminals are connected together to form the output terminal 40 of the buffer 35. The gate terminal of transistor MN5 is connected to the output 25 of the ring oscillator 10, whereas the gate terminal of transistor MP5 is connected to the frequency control signal 8 of the adjustable current source S1.

An asymmetrical current controlled oscillator 30 is differentiated from a symmetrical current controlled oscillator in that the ring oscillator 10 has either a high side current source or a low side current sink but not both, in contrast to a symmetrical current controlled oscillator.

One advantage of the asymmetrical current controlled oscillator 30, as illustrated in FIG. 1, is that the oscillator inverters 20 produce lower switching noise, in the form of a voltage variation, at the terminal 5 to which the current source S1 is connected. This is due to the fact that not all of the inverters 20 are switching at the same time; therefore, the current source S1 is continually supplying current to the inverters 20. Reduced switching noise results in a superior quality output signal 25.

Another advantage of the asymmetrical current controlled oscillator 30 is that a low supply voltage, approximately 3V, can be applied, thus reducing the power loss and increasing efficiency.

With an output stage of the type illustrated in FIG. 1, the duty cycle of the CMOS compatible output signal 40 can vary considerably over the oscillator's large operating frequency. This is disadvantageous because in certain applications, a relatively constant value of the duty cycle of the output signal is important.

The ring oscillator 10 can be designed so that its output 25 has a relatively constant duty cycle of approximately 50% over its entire operating frequency range. The variation in the duty cycle is attributed to the output buffer 35. The signal at the output 40 of the buffer 35 will have a duty cycle of less than 50% when the oscillator's operating frequency is high and a duty cycle greater than 50% when the oscillator's operating frequency is low. The reason for the variation in the duty cycle stems from the fact that the amount of current sourced by transistor MP5 is modulated as a function of the operating frequency of the oscillator 10, yet the current sinking capabilities of transistor MN5 is fixed, and the load connected to the output 40 is also fixed. The more current sourced by transistor MP5, the quicker its load switches and the less time it needs to be on.

SUMMARY OF THE INVENTION

An object of the invention is to design an output stage for an asymmetrical controlled oscillator 30, which provides a CMOS compatible output signal having a duty cycle of approximately 50% over the oscillator's entire frequency range.

This object is accomplished according to one embodiment of the invention wherein a buffer stage is provided which amplifies the output of an asymmetrical current controlled oscillator whose frequency varies as a function of a control signal. The buffer stage includes at least one buffer that is supplied by a current which is controlled in correspondence with said control signal.

According to another embodiment of the invention, a plurality of buffers are supplied by currents which are controlled in correspondence with said control signal.

According to a further embodiment of the invention, the output of an asymmetrical current controlled oscillator is firstly amplified by a buffer supplied by an adjustable current source of the asymmetrical current controlled oscillator.

BRIEF DESCRIPTION OF THE DRAWINGS

One embodiment of a circuit according to the invention is described in detail below with reference to the drawings, in which.

DETAILED DESCRIPTION

Figure 1:
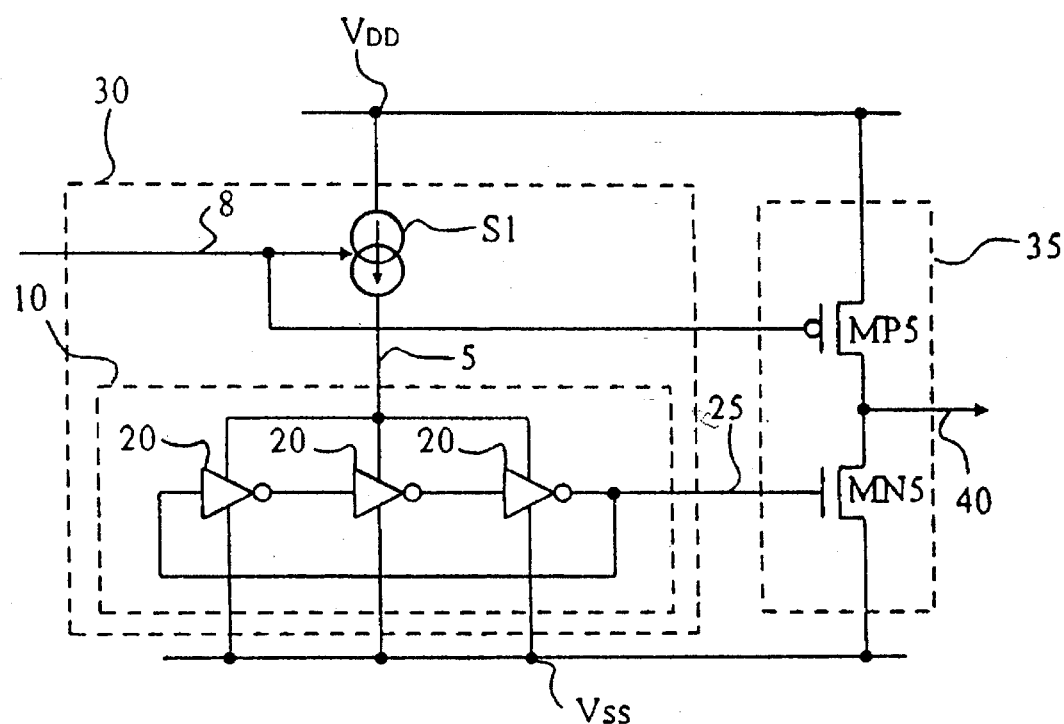
FIG. 1 is a partial schematic and partial circuit diagram of a conventional asymmetrical controlled oscillator and output driver stage.
Figure 2:
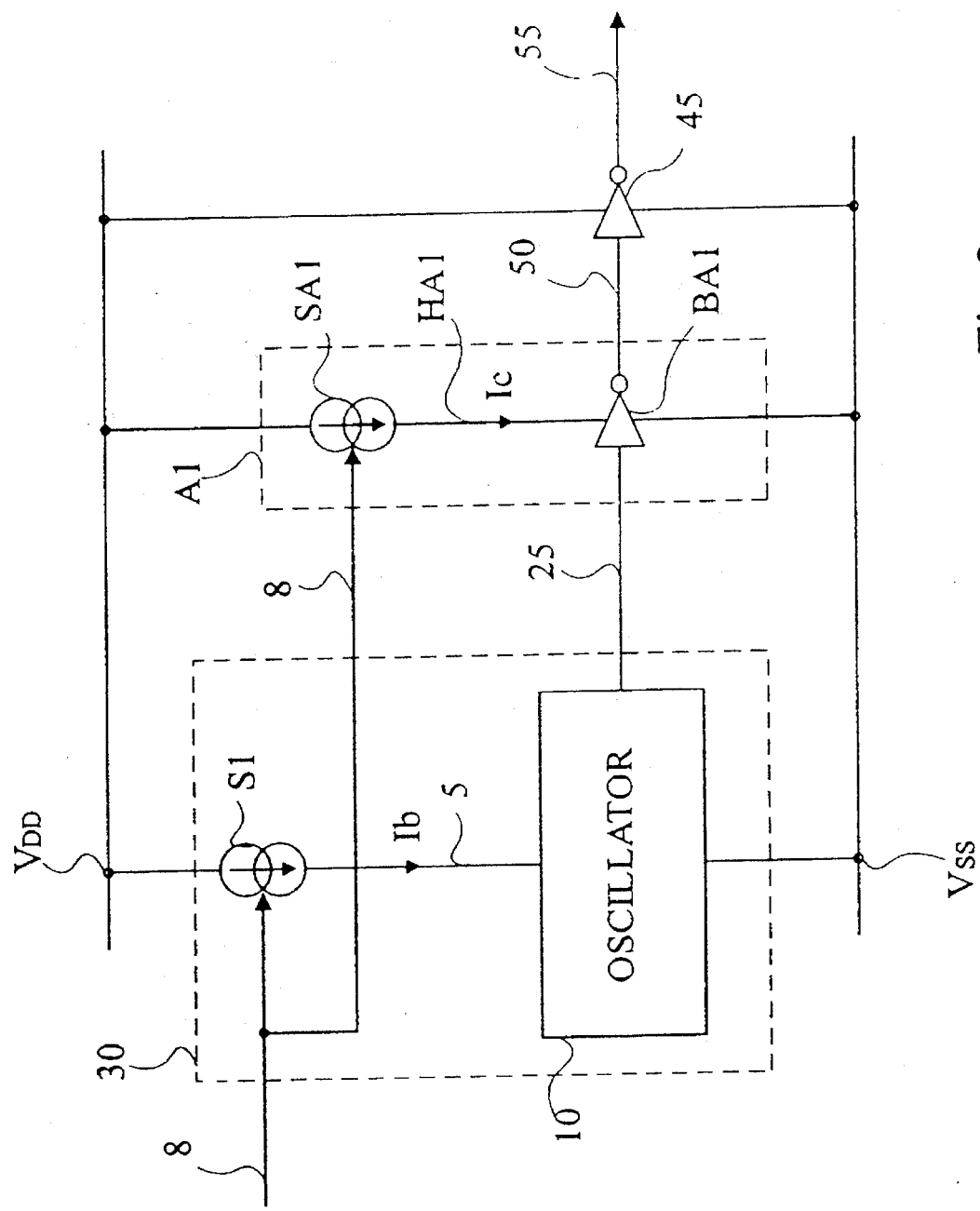
FIG. 2 is a schematic diagram of an asymmetrical controlled oscillator including an embodiment of an output driver stage according to the invention.

In FIG. 2, according to the invention, the output buffer 35 of FIG. 1 has been replaced by a current controlled buffer A1 followed by a CMOS buffer 45 which is directly supplied by the positive and negative supply rails, VDD and VSS respectively.

The current controlled buffer A1 comprises a series connected adjustable current source SA1 and a buffer BA1. The low side of buffer BA1 is connected to the negative supply rail VSS, whilst its high side HA1 is connected to the low side of current source SA1. The high side of current source SA1 is connected to the positive supply rail VDD.

The adjustable current source SA1 of buffer A1 is controlled by the same frequency control signal 8 which controls the adjustable current source S1 of the asymmetrical current controlled oscillator 30.

In order to change the frequency of the signal at the output 55 of the CMOS buffer 45, it is necessary to adjust the frequency control signal 8 of current sources S1 and SA1. Current source S1 sources a current Ib to the ring oscillator 10, whilst current source SA1 sources a current Ic to the buffer BA1. Adjusting the frequency control signal 8 will cause the magnitudes of both currents Ib and Ic to alter. An increase in the magnitude of current Ib results in an increase in the frequency of the signal at the output 25 of the ring oscillator 10 and vice-versa. Both the absolute and relative dynamic impedances of the ring oscillator 10 and the buffer BA1 remain approximately constant as their frequency of operation changes. The relative voltages presented to the respective high sides 5 and HA1 of the ring oscillator 10 and buffer BA1 remain approximately constant with a change in frequency. However, the absolute voltages presented to the respective high sides 5 and HA1 of the ring oscillator 10 and buffer BA1 will depend upon the magnitude of their respective currents Ib and Ic. Current source SA1 must be designed such that the magnitude of the current Ic it sources is greater than the magnitude of the current Ib sourced by current source S1. Since the absolute and relative dynamic impedances of the ring oscillator 10 and buffer BA1 remain approximately constant as their frequency of operation changes, the magnitude of the signal at the output 50 of buffer BA1 must be greater than that of the ring oscillator 10 because current Ic is greater than current Ib. Therefore, the current controlled buffer A1 amplifies the signal at the output 25 of the ring oscillator 10.

The buffer BA1, and the ring oscillator 10, can now be designed, by the careful choice of gate dimensional ratios (W/L), so as to generate output signals which have a duty cycle of approximately 50% without having to worry about amplifying the signal at the output 25 of the ring oscillator 10.

The buffer 45 further amplifies the 50% duty cycle signal to the rail voltages i.e. VDD minus VSS, without altering significantly the value of the duty cycle. The output 55 of the CMOS buffer 45 provides a full-swing output signal with a duty cycle of approximately 50%.

The design i.e. the absolute and relative gate dimensional ratios (W/L), of just one current controlled buffer A1 and buffer 45, so as to provide a relatively constant 50% duty cycle, can be troublesome if the current controlled oscillator 30 is required to operate over a large frequency range.

Figure 3:
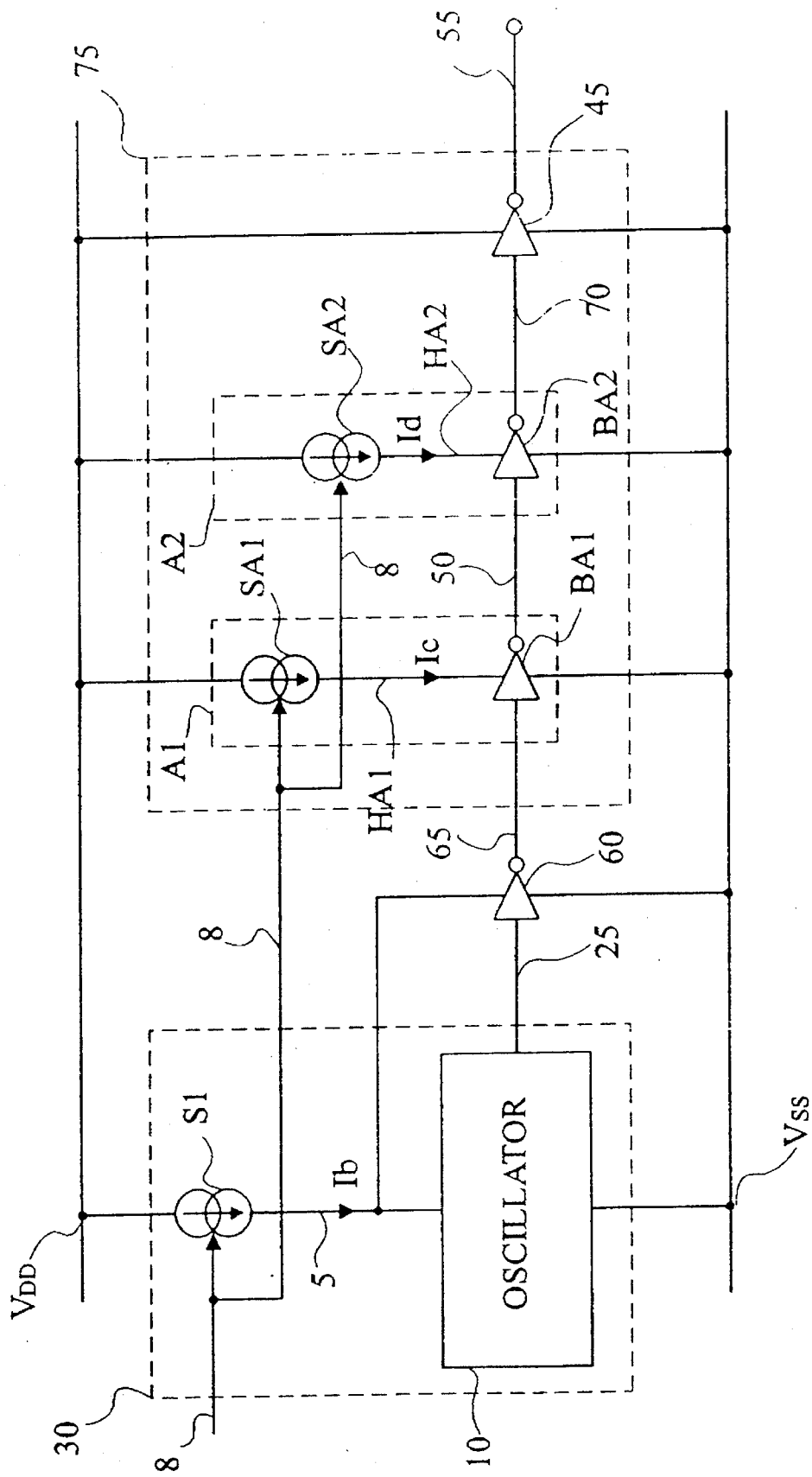
FIG. 3 is a schematic diagram of an asymmetrical controlled oscillator including a preferred embodiment of an output driver stage according to the invention; and, FIG. 4 is a detailed diagram of the circuit of FIG. 3.

FIG. 3 illustrates an embodiment of a driver stage according to the invention, which overcomes the above drawback. It differs from the stage of FIG. 2 in that there is a plurality of cascaded controlled buffers connected at the output of oscillator 10. As illustrated, there are, for example, two current controlled buffers A1 and A2, followed by buffer 45. Moreover, the inventor deduced from experiments that the system worked better if an additional ring oscillator buffer 60, supplied by the current source S1 of the current controlled oscillator 30, is connected, as illustrated, between the output 25 of the ring oscillator 10 and the input 65 of the first current controlled buffer A1.

The current controlled buffer A2 comprises a series connected adjustable current source SA2 and a buffer BA2. The low side of the buffer BA2 is connected to the negative supply rail VSS, whilst its high side HA2 is connected to the low side of its current source SA2. The high side of the current source SA2 is connected to the positive supply rail VDD.

The adjustable current source SA2 of current controlled buffer A2 is controlled by the same frequency control signal 8 which controls the adjustable current source S1 and the adjustable current source SA1.

In order to change the frequency of the signal at the output 55 of the CMOS buffer 45, it is necessary to adjust the frequency control signal 8 of current sources S1, SA1 and SA2. Current source S1 sources a current Ib to the ring oscillator 10, current source SA1 sources a current Ic to the buffer BA1, whilst current source SA2 sources a current Id to the buffer BA2. Adjusting the frequency control signal 8 will cause the magnitudes of currents Ib, Ic and Id to alter. An increase in the magnitude of current Ib results in an increase in the frequency of the signal at the output 25 of the ring oscillator 10 and vice-versa. Both the absolute and relative dynamic impedances of the ring oscillator 10 and the buffers BA1 and BA2 remain approximately constant as their frequency of operation changes. The relative voltages presented to the respective high sides 5, HA1 and HA2 of the ring oscillator 10, buffer BA1 and buffer BA1 remain approximately constant with a change in frequency. However, the absolute voltages presented to the respective high sides 5, HA1 and HA2 of the ring oscillator 10, buffer BA1 and buffer BA2 will depend upon the magnitude of their respective currents Ib, Ic and Id. Current source SA2 must be designed such that the magnitude of the current Id it sources is greater than the magnitude of the current Ic sourced by current source SA1. Current source SA1 must be designed such that the magnitude of the current Ic it sources is greater than the magnitude of the current Ib sourced by current source S1. Since the absolute and relative dynamic impedances of the ring oscillator 10, buffer BA1 and buffer BA2 remain approximately constant as their frequency of operation changes, the magnitude of the signal at the output 70 of buffer BA2 must be greater than that of buffer BA1 because current Id is greater than current Ic and the magnitude of the signal at the output 50 of buffer BA1 must be greater than that of the ring oscillator buffer 60 because current Ic is greater than current Ib. Therefore, the current controlled buffer A2 amplifies the signal at the output 50 of the current controlled buffer A1, which amplifies the signal at the output 65 of the ring oscillator buffer 60.

The buffers BA1 and BA2, and the ring oscillator 10, can now be designed, by the careful choice of gate dimensional ratios (W/L), so as to generate output signals which have a duty cycle of approximately 50% without having to worry about amplifying the signal at the output 65 of the ring oscillator buffer 60.

The buffer 45 further amplifies the 50% duty cycle signal to the rail voltages i.e. VDD minus VSS, without altering significantly the value of the duty cycle. The output 55 of the CMOS buffer 45 provides a full-swing output signal with a duty cycle of approximately 50%.

The current controlled buffers A1 and A2 together with the CMOS buffer combine to form an output driver stage 75.

Figure 4:
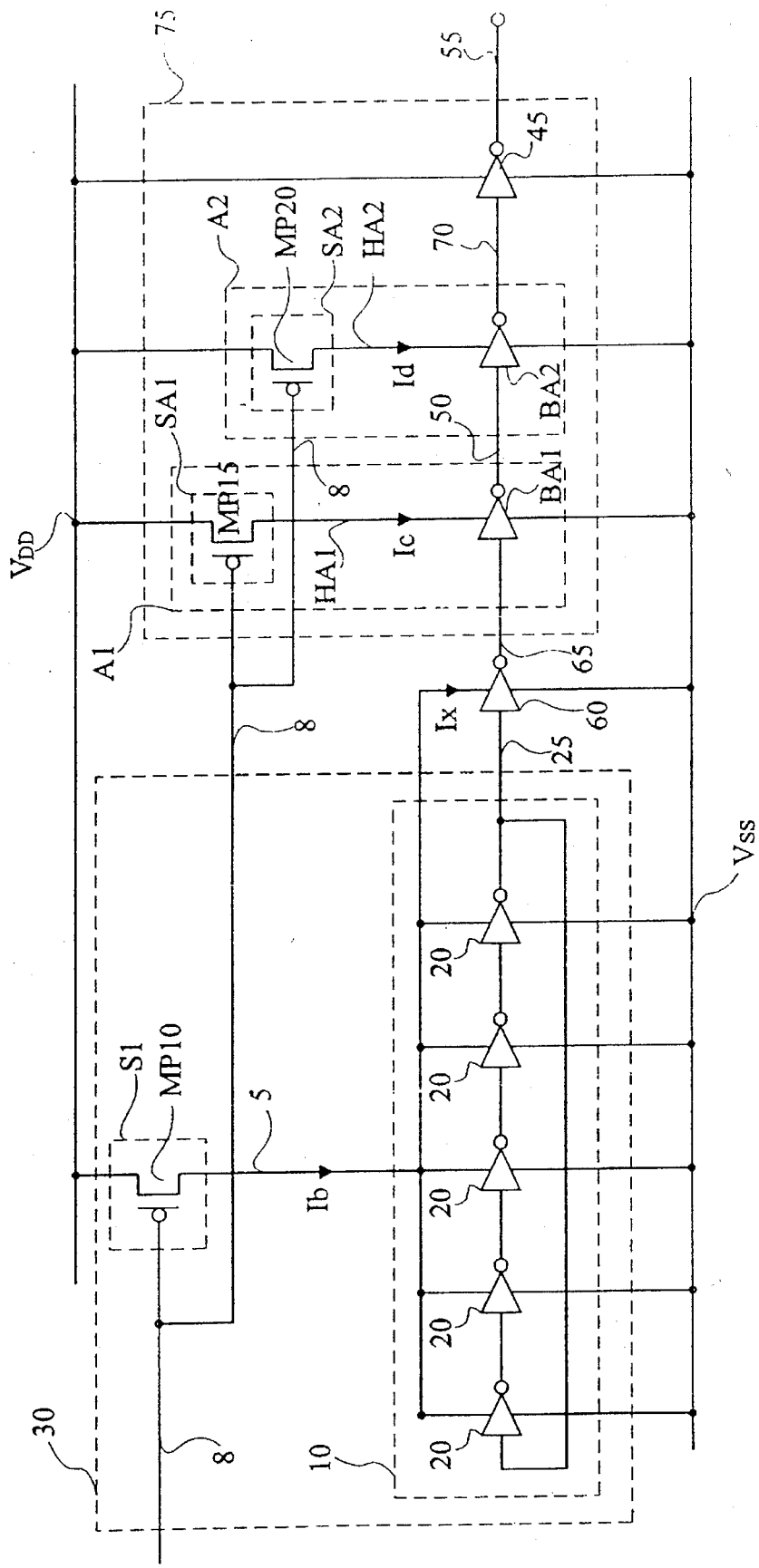

FIG. 4 illustrates in more detail the circuit of FIG. 3.

Each of the adjustable current sources S1, SA1 and SA2 are illustrated as single P-MOS transistors MP10, MP15 and MP20, respectively. The source terminals of these transistors constitute the high sides of the current sources whilst their drain terminals constitute the low sides. The gate terminals of these P-MOS transistors are all connected together.

Alternatively, each of the adjustable current sources S1, SA1 and SA2 comprises a plurality of cascoded P-MOS transistors (not illustrated).

The ring oscillator 10 of FIG. 4 differs from that of FIG. 1 in that it comprises five CMOS inverters 20 instead of just three. The inventor deduced from experiments that the use of at least five inverters 20 within the ring oscillator gave a better performance than the use of three inverters.

Referring to FIG. 4, the current source S1 sources a current Ib to the ring oscillator 10 and the ring oscillator buffer 60. The frequency of the signal at the output 25 of the ring oscillator 10 is determined by the switching times of the ring inverters 20. The switching time of each inverter 20 corresponds to the time necessary to charge and discharge the input capacitance of the successive inverter to a level, respectively, above or below the switching threshold level of the successive inverter.

The current Ib necessary to charge the input capacitances of each of the inverters 20 is supplied from the current source S1. The frequency of the ring oscillator 10 can be altered by adjusting the current source S1 so as to change the magnitude of the current Ib. The greater the magnitude of the current Ib, the greater the frequency of operation of the ring oscillator 10.

The ring oscillator buffer 60, as its name implies, buffers the output signal 25 of the ring oscillator 10. The buffered output signal 65 of the ring oscillator 10 has a duty cycle of approximately 50%. However, there is a slight variation due to the fact that the voltage low and voltage high durations are dependent upon the delays introduced by the inverters 20 in the ring oscillator 10 and the ring oscillator buffer 60. These delays are identical for both the signals mark and space. Slight effects due to the rise and fall times at the output of any of the above mentioned inverters is also present. However, this can be made negligible by using correct values of gate dimensional ratios W/L for the N-MOS and P-MOS transistors within the ring oscillator inverters 20 and the ring oscillator buffer 60.

The remaining problem is the generation of a CMOS compatible output signal 55 without sacrificing the 50% duty cycle. In order to achieve this, at least one current controlled buffer A1 is required to be connected to the output 65 of the ring oscillator buffer 60. The frequency control signal 8 of the adjustable current source SA1, within the current controlled buffer A1, is the same as the frequency control signal of the ring oscillators adjustable current source S1.

The goal to be achieved when designing a current controlled oscillator output stage 75 is to obtain a full-swing output voltage 55, having a duty cycle of approximately 50% over a wide operating frequency range. Further, the output of each individual buffer i.e. 65, 50, 70, must be greater than its input voltage i.e. 25, 65, 50, without overloading the preceding driver stage.

The maximum value of current Ic that is sourced by SA1, for a given value of gate control voltage, is determined by the gate dimensional ratio $W_{15}/L_{15}$ of the P-MOS transistor MP15. The greater the gate dimensional ratio $W_{15}/L_{15}$, the greater is the maximum value of current Ic that is sourced and vice-versa.

However, the greater the value of current Ic, the greater the size of the transistors in buffer BA1 need to be in order to conduct the maximum value of the current Ic. Therefore, the maximum value of current Ic sourced by SA1 should be such that the gate capacitances of the transistors within the buffer BA1 are not so large so as to overload the oscillator buffer 60.

If the magnitude of the current Ic is greater than the magnitude of the current Ix, which is sourced to the oscillator buffer 60, then, the magnitude of the voltage at the output 50 of the current controlled buffer A1 will be greater than the magnitude of its input voltage, i.e., the output 65 of the ring oscillator buffer 60, since the equivalent impedances of the buffers BA1 and 60 are comparable. The aforementioned principles should be applied to the design of any additional current controlled buffers.

FIG. 4 illustrates two current controlled buffers, A1 and A2. The gate dimensional ratio $W_{20}/L_{20}$ of the P-MOS transistor MP20 (SA2) must be such that the maximum value of current Id it sources to buffer BA2 is not so large so as to necessitate the use of large transistors within buffer BA2, since the gate capacitances of the large transistors would overload the driving capabilities of buffer BA1.

The fundamental principle of the invention should now be clear wherein, the current sourced (Ic, Id . . . In) by the current sources SA1, SA2 . . . SAn of each successive current controlled buffer (A1, A2 . . . An) is successively increased, which results in a successive increase in the high side voltage, and hence output voltage, of each associated buffer (BA1, BA2 . . . BAn). Thus, an output voltage is obtained which is capable of driving a buffer 45 that is connected directly across the supply voltages VDD and VSS. The result being a CMOS compatible output voltage with a duty cycle of approximately 50%.

Many modifications and changes can be made to the present invention by one who is skilled in the art without departing from the spirit or intention of the invention. Examples of some changes are:

the current sources S1, SA1 and SA2 could be implemented with a PNP-bipolar transistor;

the current sources S1, SA1 and SA2 could be implemented with cascoded transistors;

the cascoded current sources S1, SA1 and SA2 could be implemented in a combination of MOS and bipolar transistors;

the oscillator 10 could be implemented in bipolar transistors or a combination of MOS and bipolar transistors; and the output driver stage 75 could be implemented in bipolar transistors or a combination of MOS and bipolar transistors.

Another modification that can be made is to use a circuit which is symmetrical to the one described. The symmetrical implementation would involve replacement of all first conductivity type transistors with second conductivity type transistors and visa-versa and that all the transistors have their appropriate connections inverted.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A buffer stage for buffering an input signal generated by an asymmetrical current controlled oscillator that is controlled by a control signal, the input signal having a frequency that varies as a function of the control signal supplied to the oscillator, the buffer stage comprising:

an input terminal that receives the input signal;

an output terminal that outputs a buffered signal;

at least one buffer, coupled between the input and output terminals, that buffers the input signal to generate the buffered signal, the at least one buffer having a current control terminal; and at least one current source having an output coupled to the current control terminal of the at least one buffer, the at least one current source further including at least one control terminal that receives the control signal so that a magnitude of a current output from the current source is controlled by the control signal.

2. The buffer stage according to claim 1, wherein:

the at least one buffer includes at least first and second buffers connected in series;

the at least one control terminal includes at least first and second control terminals; and the first and second control terminals are respectively coupled to the first and second buffers and to first and second current signals, the first and second current signals each having a magnitude controlled by the control signal.

3. The buffer stage according to claim 1, wherein the oscillator includes a current source that generates, in response to the control signal, a current with a magnitude that determines the frequency of the input signal, and wherein the buffer stage further comprises:

an amplifying buffer having a control terminal coupled to the current source.

4. The buffer stage according to claim 2, wherein the oscillator includes a current source that generates, in response to the control signal, a current with a magnitude that determines the frequency of the input signal, and wherein the buffer stage further comprises:

an amplifying buffer having a control terminal coupled to the current source.

5. The buffer stage according to claim 1, wherein the buffered signal has a peak-to-peak voltage, and the buffer stage further comprises:

an output buffer coupled between the at least one buffer and the output terminal, the output buffer being connected between a first voltage supply having a first value and a second voltage supply having a second value so that the peak-to-peak voltage of the buffered signal extends fully between the first and second values.

6. The buffer stage according to claim 2, wherein the buffered signal has a peak-to-peak voltage, and the buffer stage further comprises:

an output buffer coupled between the at least one buffer and the output terminal, the output buffer being connected between a first voltage supply having a first value and a second voltage supply having a second value so that the peak-to-peak voltage of the buffered signal extends fully between the first and second values.

7. The buffer stage according to claim 2, wherein a magnitude of the second current signal is greater than the magnitude of the first current signal.

8. The buffer stage according to claim 7, wherein the first and second buffers are connected so that an output from the first buffer is coupled to an input of the second buffer.

9. The buffer stage according to claim 1, further comprising:

an output buffer, coupled between the at least one buffer and the output terminal, that provides a CMOS compatible buffered signal.

10. The buffer stage according to claim 2, further comprising:

an output buffer, coupled between the at least one buffer and the output terminal, that provides a CMOS compatible buffered signal.

11. The buffer stage according to claim 10, wherein the oscillator includes a current source that generates, in response to the control signal, a current with a magnitude that determines the frequency of the input signal, and wherein the buffer stage further comprises:

an amplifying buffer having a control terminal coupled to the current source.

12. A system for generating a variable frequency oscillating signal in response to a control signal, the system comprising:

an oscillator that generates a first oscillating signal having a frequency and a first duty cycle, the frequency of the first oscillating signal being determined by the control signal; and a buffer stage, coupled to the oscillator, that buffers the first oscillating signal to generate a buffered oscillating signal having a second duty cycle, the buffer stage having a control terminal that receives the control signal, the buffer stage being responsive to the control signal to control the second duty cycle so that the second duty cycle is substantially equal to the first duty cycle despite variations in the frequency of the oscillating signal.

13. The system according to claim 12, wherein the buffer stage includes at least first and second buffers connected in series and at least first and second control terminals, the first and second control terminals being respectively coupled to the first and second buffers and to first and second current signals, the first and second current signals each having a magnitude controlled by the control signal.

14. The system according to claim 12, wherein the buffer stage further includes an amplifying buffer having a control terminal coupled to an amplifier control current which has a magnitude controlled by the control signal.

15. The system according to claim 13, wherein the buffer stage further includes an amplifying buffer having a control terminal coupled to an amplifier control current which has a magnitude controlled by the control signal.

16. The system according to claim 12, wherein the buffered oscillating signal has a peak-to-peak voltage, and the buffer stage further comprises:

an output buffer connected between a first voltage supply having a first value and a second voltage supply having a second value, so that the peak-to-peak voltage of the buffered oscillating signal extends fully between the first and second values.

17. The system according to claim 13, wherein the buffered oscillating signal has a peak-to-peak voltage, and the buffer stage further comprises:

an output buffer connected between a first voltage supply having a first value and a second voltage supply having a second value, so that the peak-to-peak voltage of the buffered oscillating signal extends fully between the first and second values.

18. The system according to claim 13, wherein the magnitude of the second current signal is greater than the magnitude of the first current signal.

19. The system according to claim 18, wherein the first and second buffers are connected so that an output from the first buffer is coupled to an input of the second buffer.

20. The system according to claim 12, wherein the buffer stage further comprises an output buffer that provides a CMOS compatible buffered oscillating signal.

21. The system according to claim 13, wherein the buffer stage further comprises an output buffer that provides a CMOS compatible buffered oscillating signal.

22. The system according to claim 21, wherein the buffer stage further includes an amplifying buffer having a control terminal coupled to an amplifier control current which has a magnitude controlled by the control signal.

23. The system according to claim 12, wherein the oscillator includes a ring oscillator comprising at least five inverters.

24. The system according to claim 12, wherein the oscillator and the buffer stage are constructed and arranged so that the duty cycle of the buffered signal is constant at substantially 50% despite variations in the frequency of the first oscillating signal.

25. The system of claim 12, wherein the oscillator generates the first oscillating signal so that the first duty cycle is substantially 50%, and wherein the buffer stage is responsive to the control signal to control the second duty cycle to be substantially 50%.

26. A method of buffering an input signal to a load, the input signal having a first duty cycle and a variable frequency determined by a control signal, the method including the steps of:

A. providing a buffer that receives the input signal and generates a buffered signal that has a second duty cycle and is compatible with the load; and B. controlling the buffer so that the second duty cycle is substantially equal to the first duty cycle despite variations in the frequency of the input signal.

27. The method of buffering a variable frequency input signal according to claim 26, further including a step of:

C. generating the buffered signal to be CMOS compatible.

28. The method of claim 26, wherein the first duty cycle is substantially 50%, and wherein step B includes a step of controlling the buffer so that the second duty cycle is substantially 50%.

29. The method of claim 26, wherein step B includes a step of adjusting a current in the buffer in response to changes in the control signal so that the second duty cycle is substantially equal to the first duty cycle.

30. A system for generating a variable frequency oscillating signal, the system comprising:

an oscillator that generates a first oscillating signal having a variable frequency and a first duty cycle; and a buffer stage that buffers the first signal to generate a buffered oscillating signal having a second duty cycle, the buffer stage including means for maintaining the second duty cycle to be substantially equal to the first duty cycle despite variations in the frequency of the first oscillating signal.

31. The system according to claim 30, further including means for generating the buffered oscillating signal so that it is CMOS compatible.

32. The system according to claim 30, wherein the oscillator includes a ring oscillator comprising at least five inverters.

33. The system of claim 30, wherein the first duty cycle is substantially 50%, and wherein the means for maintaining includes means for maintaining the second duty cycle to be substantially 50%.

34. The system of claim 30, wherein the frequency of the first oscillating signal is determined by a control signal, and wherein the means for maintaining is responsive to the control signal and includes means for adjusting a current in the buffer stage in response to changes in the control signal so that the second duty cycle is maintained to be substantially equal to the first duty cycle.

* * * * *